US008201122B2

(12) United States Patent
Dewey, III et al.

(10) Patent No.: US 8,201,122 B2
(45) Date of Patent: Jun. 12, 2012

(54) COMPUTING RESISTANCE SENSITIVITIES WITH RESPECT TO GEOMETRIC PARAMETERS OF CONDUCTORS WITH ARBITRARY SHAPES

(75) Inventors: Lewis William Dewey, III, Hopewell Junction, NY (US); Tarek Ali El Moselhy, Cambridge, MA (US); Ibrahim M Elfadel, Yorktown, NY (US)

(73) Assignee: International Business Machines Corporation, Armonk, NY (US)

( * ) Notice: Subject to any disclaimer, the term of this patent is extended or adjusted under 35 U.S.C. 154(b) by 86 days.

(21) Appl. No.: 12/786,572

(22) Filed: May 25, 2010

(65) Prior Publication Data

US 2011/0296358 A1    Dec. 1, 2011

(51) Int. Cl.
*G06F 17/50* (2006.01)
(52) U.S. Cl. ........................................ 716/110
(58) Field of Classification Search .................. 716/100, 716/110
See application file for complete search history.

(56) References Cited

U.S. PATENT DOCUMENTS

| | | | | |
|---|---|---|---|---|
| 4,024,478 A | 5/1977 | Wolfe | ............................. | 333/1.1 |
| 6,022,750 A | 2/2000 | Akram et al. | ................... | 438/18 |
| 6,144,040 A | 11/2000 | Ashton | ........................... | 257/48 |
| 6,291,254 B1 | 9/2001 | Chou et al. | ...................... | 438/18 |
| 6,312,963 B1 | 11/2001 | Chou et al. | ...................... | 438/18 |
| 6,403,389 B1 | 6/2002 | Chang et al. | .................... | 438/18 |
| 6,642,737 B2 | 11/2003 | Ehnis et al. | ................... | 324/769 |
| 7,514,681 B1 * | 4/2009 | Marella et al. | ................ | 250/310 |
| 2010/0094603 A1 * | 4/2010 | Danko | ............................. | 703/2 |
| 2011/0113396 A1 * | 5/2011 | Oh et al. | ....................... | 716/113 |

FOREIGN PATENT DOCUMENTS

| | | |
|---|---|---|
| JP | 358033117 A | 2/1983 |
| JP | 09128433 A | 5/1997 |
| JP | 409180917 A | 7/1997 |

OTHER PUBLICATIONS

Qu et. al., "Finite-Element Computation of Sensitivities of Interconnect Parasitic Capacitances to the Process Variation in VLSI," IEEE Transaction on Magnetics, vol. 44, No. 6, Jun. 2008, pp. 1386-1389.
El-Moselhy et. al., "Efficient Algorithm for the Computation of Onchip Capacitance Sensitivities with respect to a lLarge Set of Parameters," Design Automation Conference, Jun. 2008, Anaheim, CA.
Sakkas, "Potential Distribution and Multi-Terminal DC Resistance Computations for LSI Technology," IBM Jour of R & D, vol. 23, No. 6, Nov. 1979, pp. 640-651.
Takahashi Mitsuhashi et al., IEEE Tran. on CAD, vol. 6 No. 3, May 1987, pp. 337-345.

* cited by examiner

*Primary Examiner* — Suchin Parihar
(74) *Attorney, Agent, or Firm* — VanLeeuwen & VanLeeuwen; Matthew W. Baca

(57) ABSTRACT

A computer system selects a shape included in an integrated circuit's layout file, and then selects a first contact and a second contact located on the shape. Next, the computer system computes a nominal resistance between the first contact and the second contact based upon a nominal boundary of the shape, and then computes an adjoint system vector based upon a perturbed boundary of the shape. Using the adjoint system vector, the computer system computes a resistance sensitivity between the first contact and the second contact. In turn, the computer system simulates the integrated circuit using the computed nominal resistance and the computed resistance sensitivity.

17 Claims, 9 Drawing Sheets

COMPUTING RESISTANCE SENSITIVITIES WITH RESPECT TO GEOMETRIC PARAMETERS OF CONDUCTORS WITH ARBITRARY SHAPES

BACKGROUND

Manufacturing variability affects integrated circuit resistance values at various points on the integrated circuit. For example, lithography, etching, and chemical-mechanical polishing, whether systematic or random, may combine to impact the boundaries of "shapes" printed on a wafer, thus leading to variations in their electrical properties. These shapes may correspond to pads, a device (e.g., transistor), wires, and/or vias that connect conductors between two metal layers or between a device layer and a metal layer.

SUMMARY

A computer system selects a shape included in an integrated circuit's layout file, and then selects a first contact and a second contact located on the shape. Next, the computer system computes a nominal resistance between the first contact and the second contact based upon a nominal boundary of the shape, and then computes an adjoint system vector based upon a perturbed boundary of the shape. Using the adjoint system vector, the computer system computes a resistance sensitivity between the first contact and the second contact. In turn, the computer system simulates the integrated circuit using the computed nominal resistance and the computed resistance sensitivity.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present disclosure, as defined solely by the claims, will become apparent in the non-limiting detailed description set forth below.

BRIEF DESCRIPTION OF THE DRAWINGS

The present disclosure may be better understood, and its numerous objects, features, and advantages made apparent to those skilled in the art by referencing the accompanying drawings, wherein.

DETAILED DESCRIPTION

Figure 1:
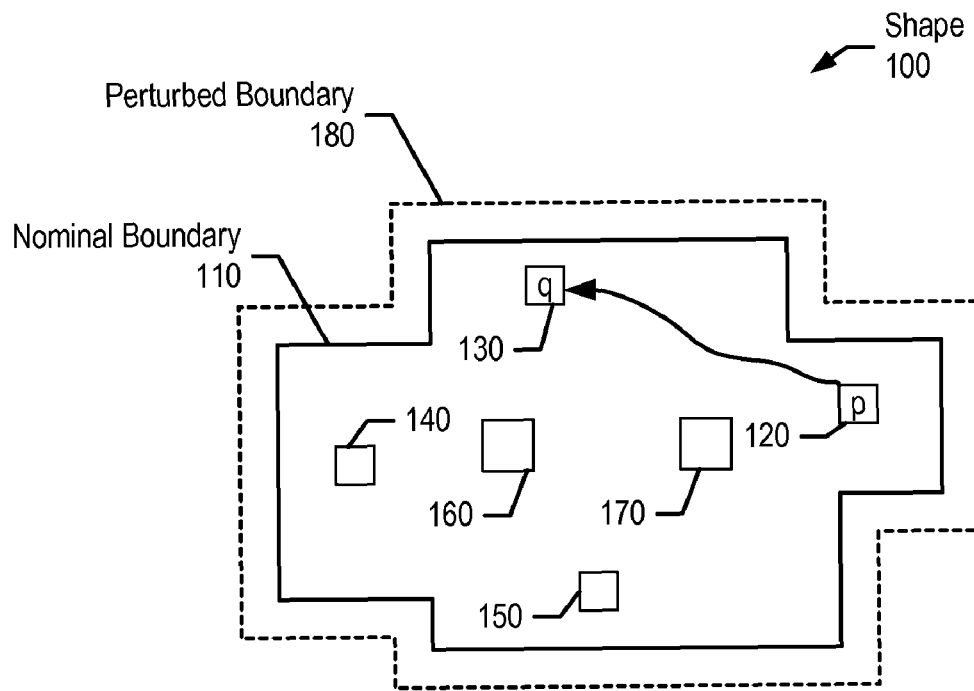
FIG. 1 is a diagram showing a shape's nominal boundary being distorted into a perturbed boundary due to manufacturing effects such as diffusion and polysilicon rounding.

Certain specific details are set forth in the following description and figures to provide a thorough understanding of various embodiments of the disclosure. Certain well-known details often associated with computing and software technology are not set forth in the following disclosure, however, to avoid unnecessarily obscuring the various embodiments of the disclosure. Further, those of ordinary skill in the relevant art will understand that they can practice other embodiments of the disclosure without one or more of the details described below. Finally, while various methods are described with reference to steps and sequences in the following disclosure, the description as such is for providing a clear implementation of embodiments of the disclosure, and the steps and sequences of steps should not be taken as required to practice this disclosure. Instead, the following is intended to provide a detailed description of an example of the disclosure and should not be taken to be limiting of the disclosure itself. Rather, any number of variations may fall within the scope of the disclosure, which is defined by the claims that follow the description.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The following detailed description will generally follow the summary of the disclosure, as set forth above, further explaining and expanding the definitions of the various aspects and embodiments of the disclosure as necessary.

FIG. 1 is a diagram showing a shape's nominal boundary being distorted into a perturbed boundary due to manufacturing effects such as diffusion and polysilicon rounding. Shape 100, in an ideal world, has nominal boundary 110. Shape 100 may be, for example, a pad, part of a device (e.g., transistor), and includes contacts 120-150 and holes 160-170. The disclosure described herein also pertains to perturbations in wires and vias, such as those connecting conductors between two metal layers or between a device layer and a metal layer (see FIG. 7 and corresponding text for further details). In one embodiment, nominal resistance and resistance sensitivities are computed for non-homogeneous conducting mediums, such as copper interconnected with high-resistively liners or multilayered vias that connect transistors to a first metal layer.

Manufacturing effects may cause nominal boundary 110 to "distort" during manufacturing. The example shown in FIG. 1 shows that nominal boundary 110 distorted to perturbed boundary 180. This distortion changes the resistance between contacts 120-150, which may change the overall performance of an integrated circuit. For example, a signal may propagate through shape 100 and, if not simulated correctly, the signal may cause a race condition (critical path) in an actual device and introduce intermittent failures.

In order to effectively simulate an integrated circuit, this disclosure computes resistance variations of an integrated circuit's "shapes" caused by manufacturing effects. This disclosure computes resistance variations using resistance sensitivities with respect to shape perturbations due to manufacturing effects. In turn, the resistance sensitivities are utilized during simulation to effectively simulate the integrated circuit (see FIGS. 3-4 and corresponding text for further details).

Figure 2:
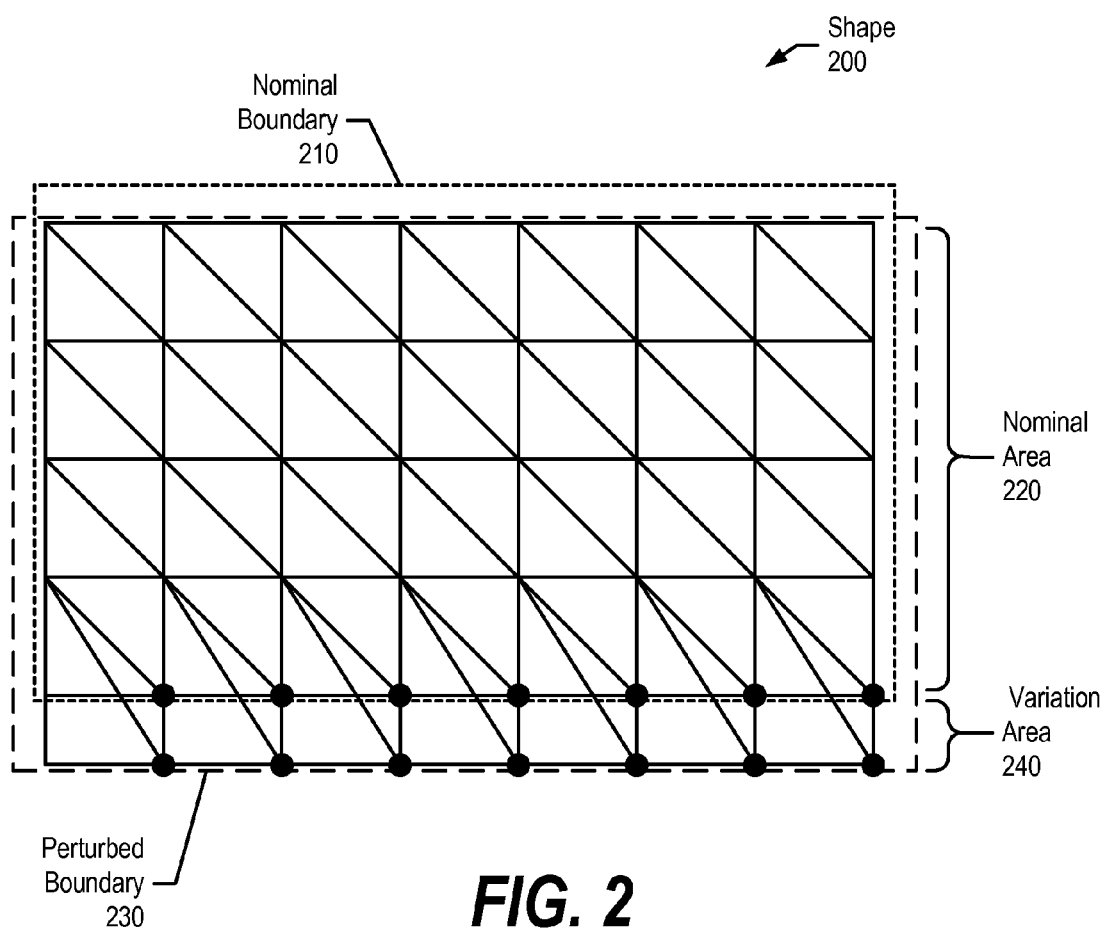
FIG. 2 is a diagram showing a shape with an overlayed triangular mesh for finite element method (FEM) computations.

FIG. 2 is a diagram showing a shape with an overlayed triangular mesh for finite element method (FEM) computations. Shape 200 includes nominal boundary 210, which corresponds to nominal area 220. Nominal area 220 yields a "nominal resistance" between two contacts. As discussed above, manufacturing effects cause a distorted boundary, such as perturbed boundary 230, which corresponds to variation area 240 and yields a "resistance variation" (computed using resistance sensitivity). As can be seen, the triangular mesh's internal nodes are unaltered, while the triangular mesh's boundary nodes fluctuate with perturbed boundary 230. As such, this disclosure computes the overall resistance of shape 200 by combining the nominal resistance with the resistance variation (positive or negative) (see FIGS. 3-4 and corresponding text for further details).

Figure 3:
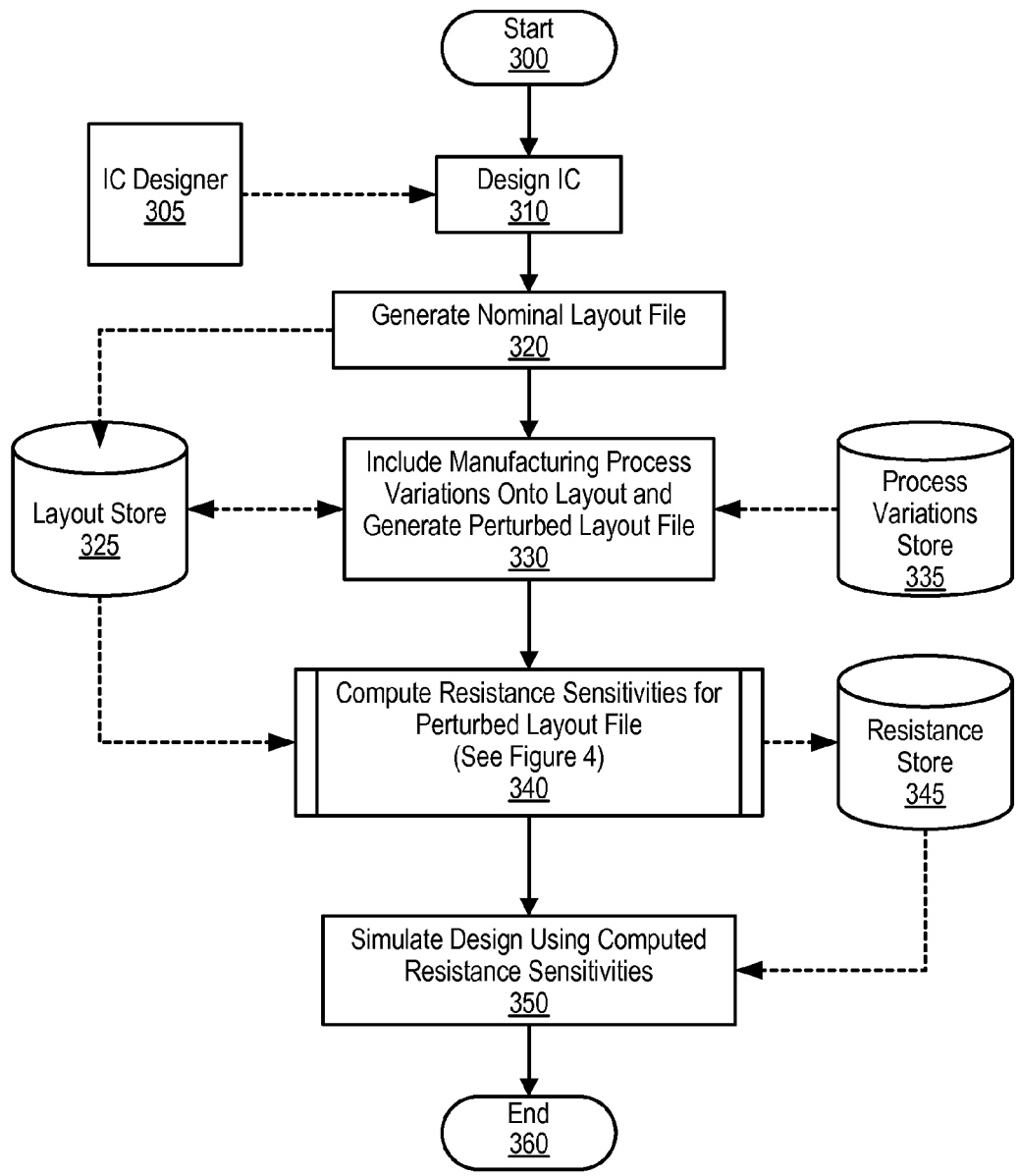
FIG. 3 is a high-level flowchart showing steps taken in designing and simulating an integrated circuit.

FIG. 3 is a high-level flowchart showing steps taken in designing and simulating an integrated circuit. Processing commences at 300, whereupon processing receives input from integrated circuit designer 305 for designing the integrated circuit at step 310. At step 320, processing generates a layout file (nominal layout file) based upon the integrated circuit's design and process parameters, and stores the nominal layout file in layout store 325. Layout store 325 may be stored on a nonvolatile storage area, such as a computer hard drive.

Next, processing retrieves manufacturing process variations from process variations store 335 and generates a perturbed layout file based upon the nominal layout file and the process variations. For example, the nominal layout file may include straight lines and sharp angles, while the perturbed layout file may include arbitrary shapes (see FIGS. 5A-7 and corresponding text for further details). Process variations store 335 may be stored on a nonvolatile storage area, such as a computer hard drive.

Figure 4:
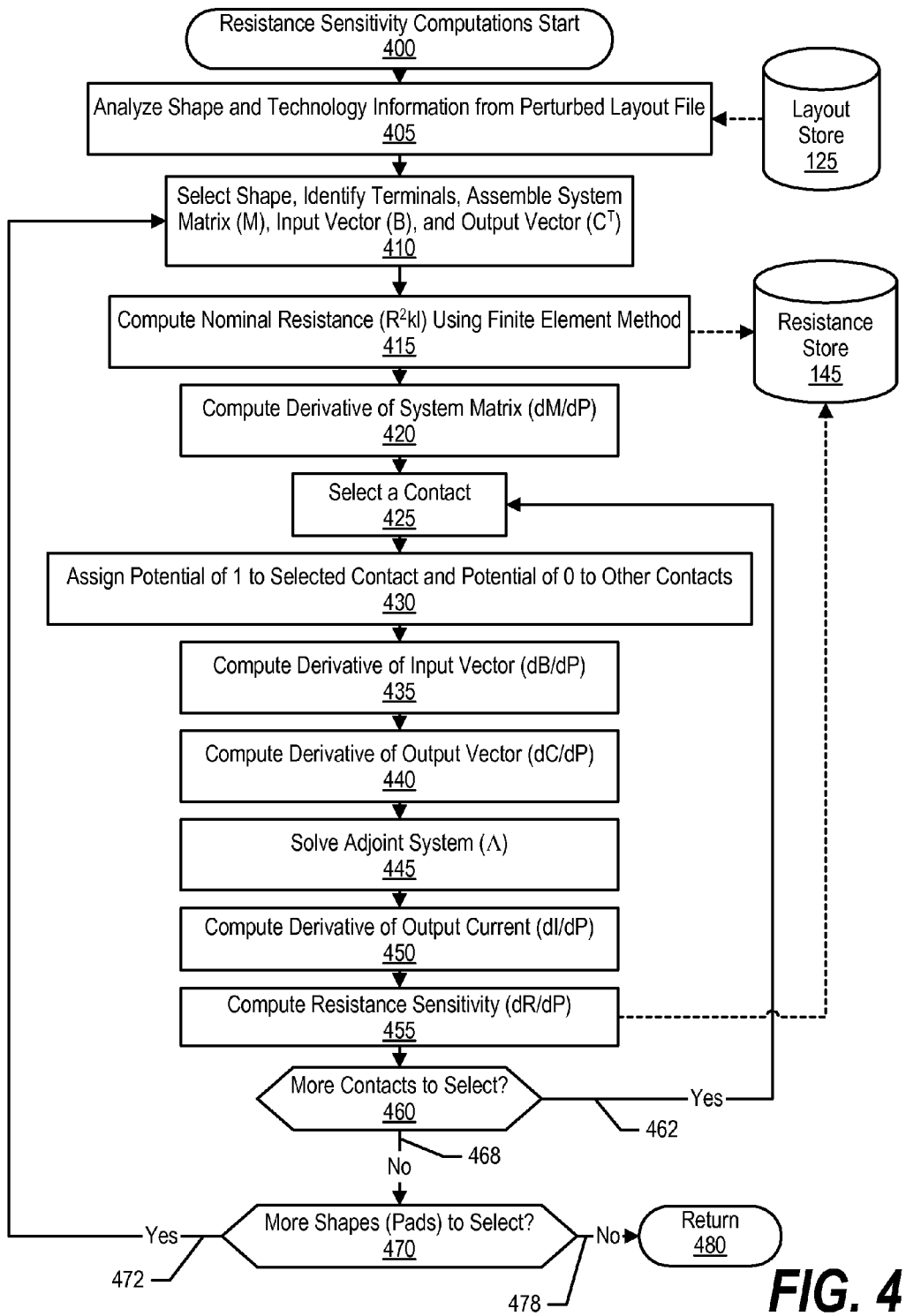
FIG. 4 is flowchart showing steps taken in computing resistance sensitivities for arbitrary shapes.

Next, processing computes resistance sensitivities for the arbitrary shapes included in the perturbed layout file using a finite element method and an adjoint method (pre-defined process block 340, see FIG. 4 and corresponding text for further details). Processing stores the resistance sensitivities in resistance store 345. Resistance store 345 may be stored on a nonvolatile storage area, such as a computer hard drive.

Processing then simulates the integrated circuit using the computed resistance sensitivities at step 350, and processing ends at 360.

FIG. 4 is flowchart showing steps taken in computing resistance sensitivities for arbitrary shapes. Processing commences at 400, whereupon processing analyzes shape and technology information from a perturbed layout file located in layout store 125 (step 405). The perturbed layout file was generated in FIG. 3 and is based upon particular manufacturing anomalies.

At step 410, processing selects a shape and identifies contacts on the shape. Processing then assembles a system matrix (M) input vector (B), and output vector ($C^T$) for finite element method (FEM) computations. As those skilled in the art can appreciate, the system matrix is a table with a matrix of coefficients for $m_{ij}$ points where i and j are the global indices of the nodes of triangles (see FIGS. 8A-C and corresponding text for further details). At step 415, processing computes a nominal resistance using Finite Element Method formulas:

$$Mv=B; \text{ (System Formula)} \qquad (1)$$

$$Iq=C^Tv; \text{ (Total Current through port } q\text{)} \qquad (2)$$

$$R=1/Iq \text{ (Resistance)} \qquad (3)$$

Since sensitivity is of interest, processing uses an explicit system formula of (1) above, resulting in $$M(P)v(P)=B(P) \qquad (4)$$

where "P" is a vector of geometrical parameters, such as the dimensions of a shape and the relative position of the contacts within the shape. As such, the impact of the variation of such parameters "P" on the computed resistances may be effectively evaluated. Using the explicit system formula (4) above, processing uses the assembled system matrix M and input vector B to compute v(P).

Processing then uses formula (2) above and computes $I_q$ using $C^T$ and the computed v. Finally, processing uses formula (3) above to compute the nominal resistance R based upon the computed $I_q$ (refer to the Resistance Calculation section below, FIGS. 8A-C, and corresponding text for further details).

At step 420, processing computes the derivative of the system matrix M relative to the vector P (system matrix derivative, refer to the Derivative Computation section below, FIGS. 8A-C, and corresponding text for further details). Processing selects a contact located on the selected shape at step 425. For example, referring to FIG. 1, processing selects contact 120 as "p." At step 430, processing assigns a potential of "1" to the selected contact and a potential of "0" to the other contacts located on the selected shape. Referring back to FIG. 1, processing assigns a potential of "1" to contact 120 and a potential of "0" to contacts 130-150.

Next, at step 435, processing computes a derivative of the input vector B (input vector derivative), which was assembled back in step 410. Processing then computes a derivative of the output vector C (output vector derivative, step 440), which was also assembled back in step 410 (refer to the Derivative Computation section below, FIGS. 8A-C, and corresponding text for further details).

At step 445, processing uses the system matrix (M) and output vector (C) assembled above to solve for the adjoint system vector (A) using the adjoint system formula:

$$M\Lambda=C => \Lambda=CM^{-1} \qquad (5)$$

Using formula (2) above, the derivative of output current $I_q$ with respect to P (output current derivative) is:

$$dI_q/dP=(dC^T/dP)v+C^T(dv/dP) \qquad (6)$$

Using formula (1) above, dv/dP may be solved as:

$$dv/dp=M^{-1}\{dB/dP-(dM/dP)v\} \qquad (7)$$

Plugging formula (7) into formula (6) yields:

$$dI_q/dP=(dC^T/dP)v+C^TM^{-1}\{dB/dP-(dM/dP)v\} \qquad (8)$$

And, substituting $C^TM^{-1}$ in formula (8) with formula (5) yields:

$$dI_q/dP=(dC^T/dP)v+\Lambda\{dB/dP-(dM/dP)v\} \qquad (9)$$

Using formula (9), processing computes the derivative of the output current $dI_q/dP$ at step 450.

As discussed in step 415, $R=1/I_q$. As such, the derivative of $R=1/I_q$ with respect to P yields:

$$dR_{pq}/dP=-R^2_{pq}(dI_q/dP) \qquad (10)$$

Processing uses formula 10 at step 455 to compute the resistance sensitivity $dR_{pq}/dP$ and store the resistance sensitivity in resistance store 145. A determination is made as to whether there are more contacts to select on the selected shape (decision 460). For example, referring back to FIG. 1, processing may select contact 130 (which processing subsequently assigns a potential of "1" and a potential of "0" to the other contacts). If there are more contacts to select, decision 460 branches to "Yes" branch 462, which loops back to select and process the next contact. This looping continues until there are no more contacts to select, at which point decision 460 branches to "No" branch 468.

A determination is made as to whether there are more shapes to select in the layout (decision 470). If there are more shapes to select, decision 470 branches to "Yes" branch 472, which loops back to select and process the next shape. This looping continues until each shape is processed, at which point decision 470 branches to "No" branch 478 whereupon processing returns at 480.

Figure 5A:
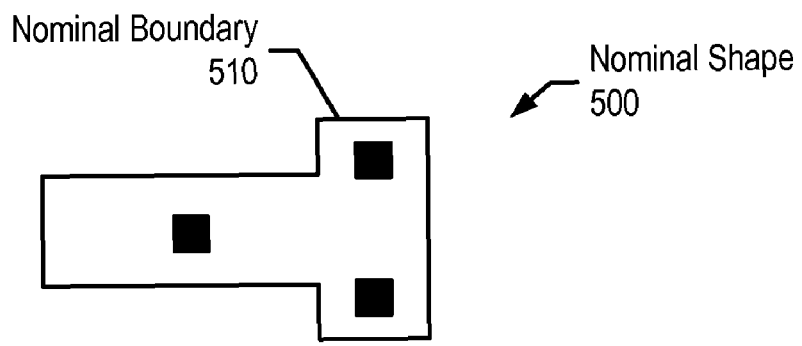
FIG. 5A is a diagram showing a nominal shape with a nominal boundary.

FIG. 5A is a diagram showing a nominal shape with a nominal boundary. Nominal shape 500 is included in a nominal layout file, which includes nominal boundary 510. When nominal shape 500 is manufactured, however, the edges and corners do not end up as shown in FIG. 5A. Rather, nominal shape 500 is distorted, such as that shown in FIG. 5B.

Figure 5B:
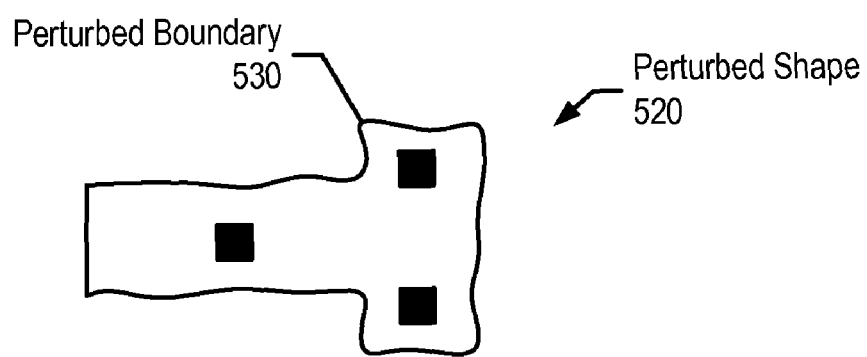
FIG. 5B is a diagram showing a perturbed shape with a perturbed boundary.

FIG. 5B is a diagram showing a perturbed shape with a perturbed boundary. Perturbed shape 520 is included in a perturbed layout file, which includes perturbed boundary 530. Perturbed shape 520 is representative of nominal shape 500 after manufacturing. As such, perturbed shape 520, which includes perturbed boundary 530, must be considered when computing resistance sensitivities for simulation purposes. The disclosure described herein may also be applied to three dimensional shapes (see FIG. 6A-7 and corresponding text for further details).

Figure 6A:
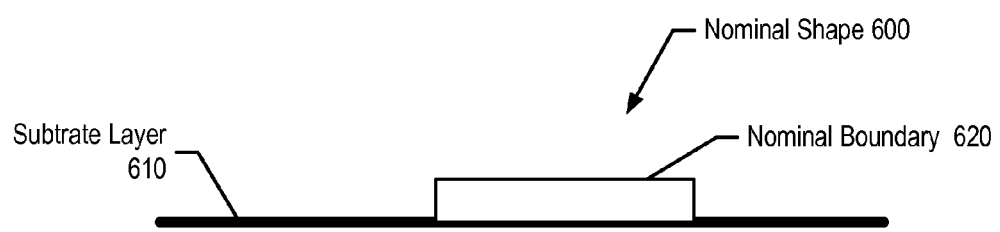
FIG. 6A is a diagram showing a nominal shape with a nominal boundary.

FIG. 6A is a diagram showing a nominal shape with a nominal boundary. Nominal shape 600 is designed to reside in a vertical plane (Z) relative to substrate layer 610's plane, and is included in a nominal layout file, which includes nominal boundary 620. When nominal shape 600 is manufactured, however, the top, sides and corners do not end up as shown in FIG. 6A. Rather, nominal shape 600 is distorted, such as that shown in FIG. 6B.

Figure 6B:
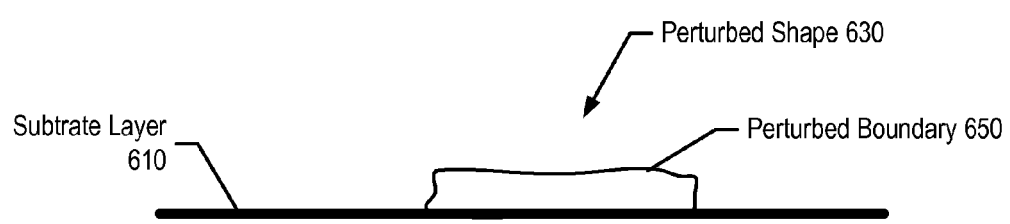
FIG. 6B is a diagram showing a perturbed shape with a perturbed boundary.

FIG. 6B is a diagram showing a perturbed shape with a perturbed boundary. Perturbed shape 630 is included in a perturbed layout file and includes perturbed boundary 650. Perturbed shape 630 is representative of nominal shape 600 after manufacturing. As such, perturbed shape 630, which includes perturbed boundary 650, must be considered when computing resistance sensitivities for simulation purposes (see FIG. 6A, 7 and corresponding text for further details).

Figure 7:
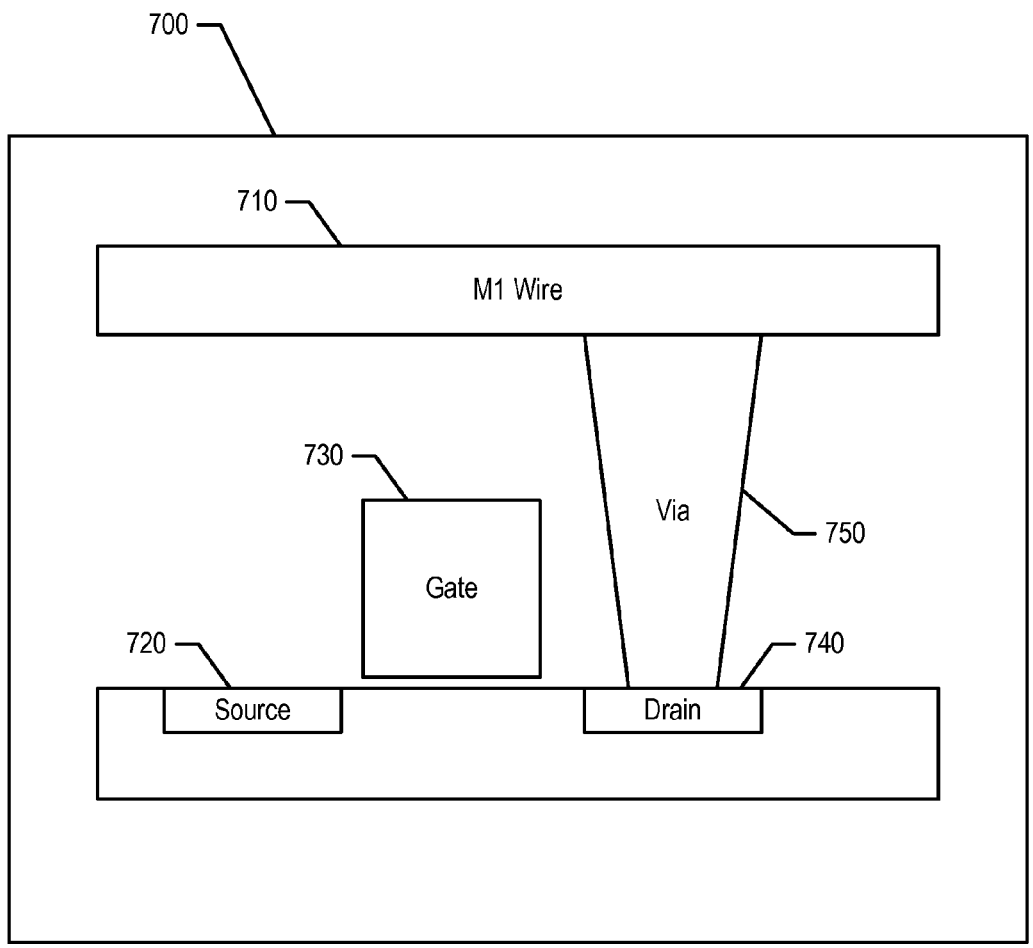
FIG. 7 is a diagram of a transistor and a perturbed via.

FIG. 7 is a diagram of a transistor and a perturbed via. Diagram 700 includes a transistor's source 720, gate 730, and drain 740. Drain 740 couples to wire 710 through via 750. In an ideal situation, via 750's boundary edges would be perpendicular to wire 710. However, due to manufacturing anomalies, via 750 has a perturbed boundary. The disclosure described herein provides the capability to compute via 750's resistance sensitivity with its perturbed shape, and perform simulation using via 750's computed resistance sensitivity.

A further detail description is below regarding resistance calculations, finite element method computations, adjoint sensitivity analysis, output function definition, and computing derivatives with respect to the geometrical parameter vector P. Some symbols in the description below may not be the same as those used in the above description. For example, the description above uses the symbol "v" for potential and the description below uses the symbol "$\phi$" for potential. Those skilled in the art can appreciate and correlate the symbols used in the description below with the symbols used in the description above.

In a variation-aware VLSI extraction flow, both the nominal resistance and the sensitivity of the resistance to the geometrical variations may be utilized to predict the resistance of a slightly perturbed shape. More precisely, one may approximate the resistance function using a multivariate, first-order Taylor expansion $$R = R_0 + \sum_m \frac{\partial R}{\partial p_m} \Delta p_m \qquad (11)$$

where $\Delta p_m$ is the perturbation around a nominal value of a parameter "$p_m$," and $\partial R/\partial p_m$ is the sensitivity (expressed as a partial derivative) of the resistance with respect to such perturbation. An algorithm for computing such sensitivities for conductors of arbitrary shapes is presented in this disclosure. In particular, a FEM resistance calculation tool may be augmented with a sensitivity calculation capability using adjoint variational analysis.

In a VLSI layout extraction flow, FEM may be used in two different approaches. The first approach is to compute accurate look-up tables of specific wiring patterns for which the wire-like resistance formula will fail. Such computations are done off-line and do not impact the processing cost of the resistance extraction step. The second approach is on-line where FEM is applied very selectively. In the latter approach, caching and pattern recognition are extensively employed to reduce the number of times the FEM solver is actually called. Another important aspect is that in the full layout extraction flow, the overall performance is gated by the capacitance extraction phase rather than the resistance extraction phase. This disclosure discusses FEM-based resistance sensitivities within the overall VLSI layout extraction context.

Resistance Calculation

Resistance calculation is governed by the following partial differential equations:

$$\nabla \cdot (\sigma(r)(-\nabla \phi(r))) = 0 \quad r \in D$$

$$\sigma(r)(-\nabla \phi(r)) \cdot \hat{n} = 0 \quad r \in \partial D_{nc}$$

$$\phi(r) = \phi_0 \quad r \in \partial D_c \qquad (12)$$

where $\phi(r)$ is the electric potential, $\sigma(r)$ is the electric conductivity of the material, D is the closed domain of the problem, $\partial D_{nc}$ is the union of the boundary segments which are not assigned a particular potential (referred to as non-terminal), $\partial D_c$ is the union of the boundary segments which are assigned a specific potential (referred to as terminal), and $\hat{n}$ is the normal to the boundary surface. The second equation is the Neumann boundary condition at the non-terminal boundary of the problem and indicates that the current does not flow outside of the metal (the perpendicular current component vanishes). The last equation is the Dirichlet boundary condition at the terminals with prescribed potential $\phi_0$. For a set of $N_c$ contacts the resistance between contacts p and q is computed by assigning unit potential to contact p (e.g., $\phi p = V_p (=1)$, and assigning zero potential to all other contacts. In turn, formula 12 above may be solved to find $\phi(r)$ everywhere in D and subsequently computes the total current entering contact q as $$I_q = \int_{\partial D_{cq}} \sigma(r)(-\nabla \phi(r)) \cdot \hat{n} \, dS$$

where $\partial D_{cq}$ is the boundary of contact q. In turn, the required resistance is $R(p,q) = V_p/I_q$. As can be seen, one simulation is required to compute an entire row of the resistance matrix $R(p,x): 1 \leq x \leq N_c$.

Finite Element Method (FEM)

For the sake of simplicity, FEM is discussed below in a two-dimensional (2D) aspect. As those skilled in the art can appreciate, FEM as discussed below may also be extended to a three-dimensional aspect. Since formula (12) above has mixed Dirichlet-Neumann boundary conditions, the continuous FEM formulation is derived from minimizing the following energy functional:

$$E(\phi(x,y)) = \int_D \sigma(x,y) \nabla \phi(x,y) \cdot \nabla \phi(x,y) dx dy \qquad (13)$$

Figure 8A:
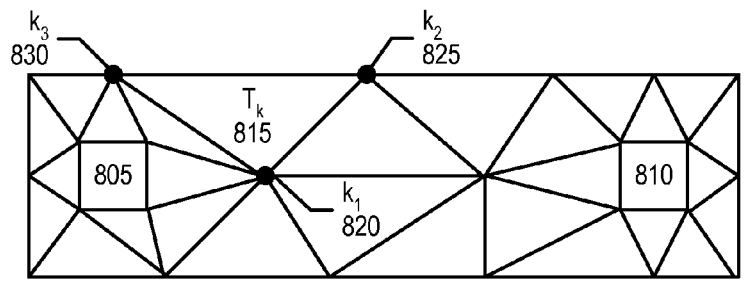
FIG. 8A is a diagram of a triangular mesh overlayed on a shape.
Figure 8B:
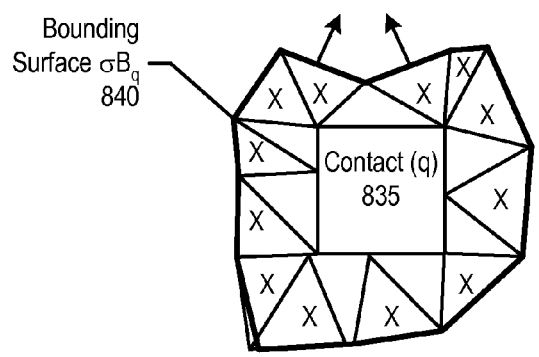
FIG. 8B is a diagram of a bounding surface around a contact.

Referring to FIG. 8A's diagram 800, which includes contacts 805 and 810, in order to solve for $\phi(r)$, the geometry is first subdivided into smaller elements. For 2D structures, the Delaunay triangulation is used for the discretization, since it tends to guarantee triangles of reasonable aspect ratios. The resulting elements are described by the coordinates of their nodes. Each node has a unique global index to identify it in the mesh as well as a local index within each triangle it belongs to. Clearly, a given node may have more than one local index, since it may belong to more than one triangle. The local nodes shown in triangle $T_k$ 815 are labeled $k_1$ 820, $k_2$ 825, and $k_3$ 830. The potential within each triangular element is then approximated using a basis of polynomial functions. For simplicity, this basis is taken to be that of first-order polynomials, so that $$\phi(x,y) = \beta_x x + \beta_y y + \beta_0 \qquad (14)$$

Consequently, the potential of every element $T_k$ 815 is described by the three unknown potentials of its nodes $\phi(k_1)$, $\phi(k_2)$, and $\phi(k_3)$ and three coefficients $\beta_x$, $\beta_y$, and $\beta_0$ of formula (14). The gradient of the potential in formula (14) may then be rewritten in terms of the nodal potential as $$\nabla \phi = \sum_{i=1}^3 \frac{1}{\alpha_{T_K}} A(k_i) \phi(k_i)$$

$$A(k_i) = (y_{k_{i+1}} - y_{k_{i-1}}) \hat{x} + (x_{k_{i-1}} - x_{k_{i+1}}) \hat{y}$$

where the coordinates of the node $k_i$ are $(x_{ki}, y_{ki})$; $\alpha_{Tk}$ is the area of triangle 815, and $\hat{x}$ and $\hat{y}$ are the unit vectors of the x and y axis. Substituting in formula (13) the discretized quadratic form $$E(\phi) = \phi_n^T A \phi_n \tag{15}$$

where $\phi_n$ is the vector of all node potentials in the mesh and A is the system matrix. The elements of A are written in a compact form $$A(i,j) = \sum_{k:(i,j)\in T_k} \frac{\sigma(k)}{\alpha_{T_k}} A(k_i) \cdot A(k_j) \tag{16}$$

where i and j are the global indices of the nodes, k is the index of the triangle, $(i,j)\in T_k$ means that i and j belong to a triangle $T_k$, and $\Sigma(k)$ is the conductivity of the region bounded by triangle $T_k$. It is further assumed that the local indices of i and j in $T_k$ are $k_i$ and $k_j$, respectively. Formula (15) is then rewritten as $$\phi_n^T \begin{pmatrix} A_{11} & A_{12} \\ A_{21} & A_{22} \end{pmatrix} \phi_n = \phi_1^T A_{11} \phi_1 + \phi_2^T A_{21} \phi_1 + \phi_1^T A_{12} \phi_2 + \phi_2^T A_{22} \phi_2 \tag{17}$$

where $\phi_1$ is the vector of the unknown potential (potential of all N non-contact nodes), $\phi_2$ is the vector of the known fixed potential (potential of $N_f$ nodes on the contacts), $A_{11}$ represents the self interaction of the non-contact nodes, $A_{12}=A^T_{21}$ mutual interaction of contact and non-contact nodes, and $A_{22}$ self interactions of the contact nodes. Formula (17) is then minimized with respect to the unknown potential vector $\phi_1$ to obtain $$A_{11}\phi_1 = -A_{12}\phi_2 \tag{18}$$

Formula (18) is cast in the standard compact form $M\phi=b$, where $M=A_{11}$, $\phi=\phi_1$ and $b=-A_{12}\phi_2$. This linear system is then solved for $\phi$ to obtain the potential everywhere inside the domain D. As discussed above, in order to obtain a sensitivity calculation, the dependence of M, $\phi$, and b on the problem parameters is made explicit, so the above linear system is written as $$M(P)\phi(P) = b(P) \tag{19}$$

where P is a vector of geometrical parameters, such as the dimensions of the structure and the relative position of the contacts within it. The goal is to efficiently evaluate the impact of the variation of such parameters on the computed resistances.

Adjoint Sensitivity Analysis

The adjoint sensitivity computation is an efficient algorithm for finding the sensitivity of a given vector $f(P, \phi(P))$ of length $n_O$ with respect to a parameter vector P of length $n_P$. A simple derivation of the adjoint method is summarized below.

Taking the total derivative of $f(P, \phi(P))$ with respect to P results in $$\frac{df(P, \phi(P))}{dP} = \frac{\partial f(P, \phi(P))}{\partial P} + \frac{\partial f(P, \phi(P))}{\partial \phi(P)} \frac{d\phi(P)}{dP} \tag{20}$$

where $$\frac{df(P, \phi(P))}{dP}, \frac{\partial f(P, \phi(P))}{\partial P}$$

are matrices of size $n_o \times n_p$, $$\frac{\partial f(P, \phi(P))}{\partial \phi(P)}$$

is a matrix of size $n_o \times N$ and $$\frac{d\phi(P)}{dP}$$

is a matrix of size $N \times n_p$.

Direct sensitivity methods are based on computing $$\frac{d\phi(P)}{dP}$$

using a finite difference (FD) perturbation for each component of P, which is computationally very expensive since it requires $n_p$ independent system solves. However, taking the derivative of linear system (19) with respect to P results in the formula $$\frac{\partial M(P)\phi(P)}{\partial P} + M(P)\frac{d\phi(P)}{dP} = \frac{db(P)}{dP} \tag{21}$$

Solving for $$\frac{d\phi(P)}{dP}$$

and substituting into (20) results in the formula $$\frac{df(P, \phi(P))}{dP} = \frac{\partial f(P, \phi(P))}{\partial P} + \frac{\partial f(P, \phi(P))}{\partial \phi} M(P)^{-1} \tag{22}$$

$$\left(\frac{db(P)}{dP} - \frac{\partial M(P)\phi(P)}{\partial P}\right)$$

Defining now the adjoint vector $\Lambda$ as the solution of the adjoint linear system $$M(P)^T \Lambda = \left(\frac{\partial f(P, \phi(P))}{\partial \phi(P)}\right)^T \tag{23}$$

the following equation is derived for the adjoint sensitivity method $$\frac{df(P,\phi(P))}{dP} = \frac{\partial f(P,\phi(P))}{\partial P} + \Lambda^T\left(\frac{db(P)}{dP} - \frac{\partial M(P)\phi(P)}{\partial P}\right) \quad (24)$$

The main advantage of the adjoint method is that with only two system solves, one for the nominal system (19) and one for the adjoint system (23), the sensitivity of $f(P,\phi(P))$ with respect to an arbitrary number of parameters $n_P$ may be computed. In other words, when compared with the standard direct sensitivity method, the time complexity of the adjoint method is independent of the number of parameters. Furthermore, its accuracy is independent of numerical differentiation.

Defining the Output Function

Recall that the resistance $$R_{pq} = \frac{V_p}{I_q}$$

is a function of the total current $I_q$ at a particular contact q, which in turn is a linear function of the potential $\phi(r)$. The total derivative of the resistance with respect to the parameter vector P is given by the formula $$\frac{dR_{pq}}{dP} = -\frac{V_p}{I_{pq}^2}\frac{dI_q}{dP} \quad (25)$$

Consequently, the quantity of interest to extract $R_{pq}$ is the total current at contact q due to a unit potential $V_p=1$ excitation at contact p, (e.g., the q-th component of the output vector is given by $f(P,\phi(P))(q)=I_q$). Referring to FIG. 8B, bounding surface $\delta B_q$ 840 is a hypothetical closed boundary surrounding contact q 835. By current continuity, the net current flowing through contact q 835 is the same as the net current flowing through bounding surface $\delta B_q$ 840. The latter is computed from the relation between the current density and the potential $$I_q = -\int_{\partial B_q} \sigma(r)\nabla\phi(r)\cdot\hat{n}\,dl$$

where bounding surface $\delta B_q$ 840 is constructed as the union of the sides of the triangles touching contact q 835 at a single point (marked with "X's"). Without loss of generality, the local numbering of these triangles is made such that the point touching the contact may be numbered $l_1$, where l is the index of the triangle. Let the side of triangle $T_l$ belonging to bounding surface $\delta B_q$ 840 be referred to as $\delta B_{ql}$ 840. Note that the local normal to the boundary is the unit vector in direction of $A(l_1)$, i.e., $\hat{n}=\hat{n}(l_1)=\hat{A}(l_1)$. The $I_q$ integral is discredited as $$I_q = \sum_{T_l}\int_{\partial B_{ql}}\sum_{k=1}^{3}\frac{\sigma(l)}{\alpha_{T_l}}A(l_k)\phi(l_k)\cdot\hat{A}(l_1)\,d\ell$$

$$= \sum_{T_l}\sum_{k=1}^{3}\frac{\sigma(l)}{\alpha_{T_l}}A(l_k)\phi(l_k)\cdot\hat{A}(l_1)\int_{\partial B_{ql}}d\ell$$

$$= \sum_{T_l}\sum_{k=1}^{3}\frac{\sigma(l)}{\alpha_{T_l}}A(l_k)\cdot A(l_1)\phi(l_k)$$

where the relation $$A(l_1) = \hat{A}(l_1)\int_{\partial B_{ql}}d\ell$$

is used.

Note that due to the assumed local indexing of triangle $T_l$, node $l_1$ is on the boundary of the contact and $\phi(l_1)=0$. This leads to the formula $$I_q = \sum_{T_l}\sum_{k=2}^{3}\frac{\sigma(l)}{\alpha_{T_l}}A(l_k)\cdot A(l_1)\phi(l_k)$$

which is simply the addition of the contributions of all the points on boundary surface $\delta B_q$ 840 that are connected to points on the contact boundary. A careful investigation of this formula reveals that with the aid of formula (17), it can be cast in the following compact form $$I_q = S_q(A_{21}\phi_1 = A_{22}\phi_2) \quad (26)$$

where $S_q$ is a row vector of zeros and ones and the rest of the notation is as in (17). $S_q$ has ones at columns corresponding to the global indices of the nodes representing contact q 835. Formula (26) indicates that the total current depends linearly on the potential of any point connected to a boundary point through a common triangle. More importantly, formula (26) indicates that the entries of the output matrices $S_qA_{21}$ and $S_qA_{22}$, along with those of both the system matrix M and the RHS vector b all share the same formulas, i.e., they all rely on elements of the form in formula (26). This is useful when derivatives of such elements with respect to geometrical variations are computed (discussed below). Finally, formula (26) may be cast in a more compact linear relation between the current and potential $$I(\phi(P),P) = C_1^T(P)\phi(P) + C_2^T(P)\phi_2 \quad (27)$$

where $\phi(P)$ is the unknown potential of the non-contact nodes, and $\phi_2$ is the vector of fixed potentials of the contact nodes and is of length $N_f$, while $C_1(P)$ and $C_2(P)$ are known parameter-dependent matrices of size $N\times n_0$ and $N_f\times n_o$, respectively. Note that the above derivation is valid only for contacts that are assigned zero potential, i.e., $q\neq p$, where p is the index of the excited contact. However this is not a limitation since only one contact is assigned a nonzero potential and the self-resistance of such contact is given by the sum of all the mutual resistances of the contact $$R_{pp} = \sum_{q=1,q\neq p}^{N_c} R_{pq}.$$

Finally, the derivatives of the current function required for the adjoint formulas (23) and (24) are given by $$\frac{\partial I(\phi(P), P)}{\partial p_i} = \frac{dC_1^T(P)}{dp_i}\phi(P) + \frac{dC_2^T(P)}{dp_i}\phi_2$$

$$\frac{\partial I(\phi(P), P)}{\partial \phi} = C_1^T(P)$$

where $p_m$ is the m-th component of P.

Derivative Computations with Respect to Parameter Vector P

In this subsection, the derivatives of the different matrix and vector entries with respect to the parameter vector P are computed. First, the matrix elements of the system matrix M, the right hand side vector b and the output matrices $C_1$ and $C_2$ are all computed from formula (26) and therefore computing the derivative of formula (26) with respect to the geometrical parameters covers all the required derivatives. Second, since all the entries of the matrices and vectors depend solely on the coordinates of the nodes, all geometrical perturbations may be defined by their effect on such nodal coordinates. Using formula (26) the derivative of any matrix element with respect to the geometrical parameter $p_m$ is given by $$\frac{dA(i,j)}{dp_m} = \sum_{k:(i,j)\in T_k} \sum_{z_l\in T_k} \frac{\partial a(k_i, k_j)}{\partial z_l} \frac{dz_l}{dp_m} \quad (28)$$

$$a(k_i, k_j) = \frac{\sigma(k)}{\alpha_{T_k}} A(k_i) \cdot A(k_j)$$

where $z_l$ is one of the six coordinates (x and y coordinates of the three nodes of the triangle) on which the term $A(i,j)$ depends. The global indices of the nodes of triangle $T_k$ are (i,j,l) and the corresponding local indices are ($k_i$, $k_j$, $k_l$). The computation of $$\frac{\partial a(k_i, k_j)}{\partial z_l}$$

is illustrated by the following example. The goal is to compute $$\frac{\partial a(k_i, k_j)}{\partial z_l}$$

where $z_l = x_l$, the x coordinate of the l-th global node in triangle $T_k$. This is achieved through the following algebra steps $$a(k_i, k_j) = \frac{\sigma(k)}{\alpha_{T_k}}\left((y_{k_j} - y_{k_l})(y_{k_l} - y_{k_i}) + (x_{k_l} - x_{k_j})(x_{k_i} - x_{k_l})\right) \quad (29)$$

$$\frac{\partial a(k_i, k_j)}{\partial x_l} = \frac{\sigma(k)}{\alpha_{T_k}}(-2x_{k_l} + x_{k_j} + x_{k_i}) + \frac{-\sigma(k)}{\alpha_{T_k}}\frac{\partial \alpha_{T_k}}{\partial x_{k_l}} a(k_i, k_j)$$

$$\alpha_{T_k} = 0.5\left((x_{k_j} - x_{k_i})(y_{k_l} - y_{k_i}) - (x_{k_l} - x_{k_i})(y_{k_j} - y_{k_i})\right)$$

$$\frac{\partial \alpha_{T_k}}{\partial x_{k_l}} = -0.5(y_{k_j} - y_{k_i})$$

Figure 8C:
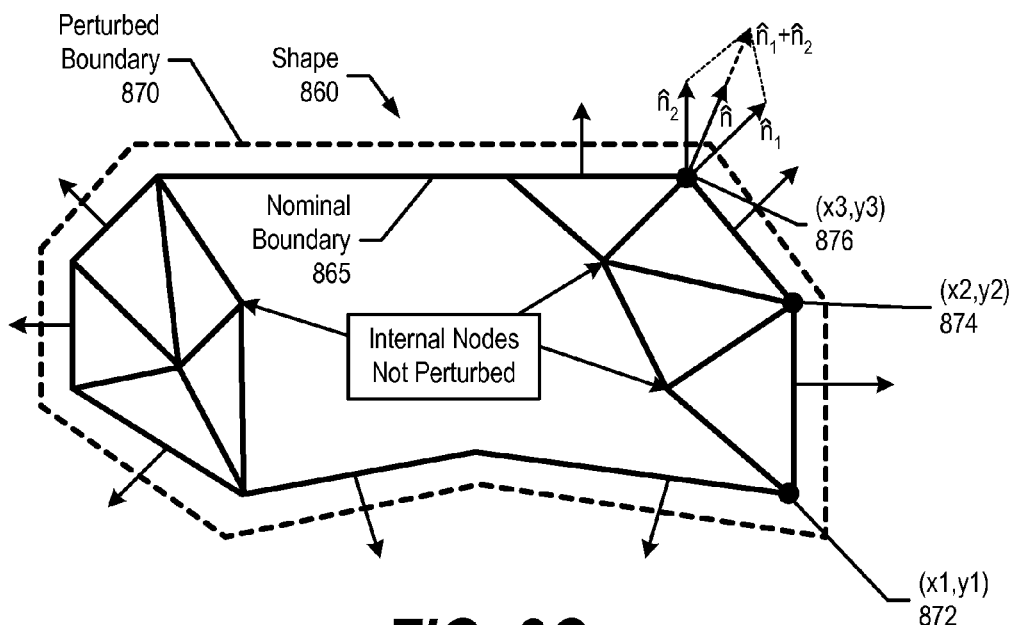
FIG. 8C is a diagram of a perturbed boundary and a nominal boundary.

Next, the chain rule factor $$\frac{dz_l}{dp_m}$$

in formula (18) may be computed using an instance of a generic perturbation that implements uniform shape changes such as expansion or shrinking, as shown in FIG. 8C.

Since this type of perturbations affects only the boundary of the structure, all the internal nodes will remain unchanged, i.e., $$\frac{dz_l}{dp_m} = 0$$

for any $z_l$ coordinate of an internal node. Only nodes defining the outer boundary will change. The direction of the boundary node perturbation is in the average direction of the normals to both boundary segments connected through the node. This is direction $\hat{n}$ in FIG. 8C. As an example, the node direction $\hat{n}$ can be computed in the direction of perturbation of $(x_2, y_2)$ $$\hat{n} = \frac{1}{\|\hat{n}_1 + \hat{n}_2\|}(\hat{n}_1 + \hat{n}_2)$$

where $\|v\|$ is the length of vector v and $$\hat{n}_1 = \frac{1}{\sqrt{(y_3 - y_2)^2 + (x_2 - x_3)^2}}((y_3 - y_2)\hat{x} + (x_2 - x_3)\hat{y})$$

$$\hat{n}_2 = \frac{1}{\sqrt{(y_2 - y_1)^2 + (x_1 - x_2)^2}}((y_2 - y_1)\hat{x} + (x_1 - x_2)\hat{y})$$

Consequently, the sensitivities of coordinates $(x_2, y_2)$ to a small node perturbation $p_i$ along the normal $\hat{n}$ are given by $$\frac{dx_2}{dp_i} = \hat{n}\cdot\hat{x} \quad \frac{dy_2}{dp_i} = \hat{n}\cdot\hat{y} \quad (30)$$

As those skilled in the art can appreciate, the approach suggested above for defining a perturbation is in fact general and can be used to model any geometric perturbation of either the domain boundaries or the contact locations. All that is required is to determine the set of nodes defining the perturbation, determine the changes in the coordinates of these nodes in response to a unit variation, and finally determine the partial derivatives.

Complexity Analysis of Sensitivity Extraction

A FEM system matrix M is symmetric and very sparse. Moreover, by proper numbering of the nodes in the FEM mesh one can generate a banded system matrix M. The maximum bandwidth B of the matrix is the maximum difference between the global indices of any interacting non-contact nodes (e.g., nodes that share a common triangle). As discussed below, B is assumed a constant much smaller than N but in the order of both $n_p$ and $n_o$. The most important observation is that the adjoint system matrix in formula (23) is the transpose of the matrix M. Because the matrix M is symmetric, both the linear system and the adjoint system have the same system matrix. Following all the previous observations the complete set of equations may be summarized as $$M(P)[\phi(P) \ \Lambda] = [b(P) \ C_1(P)]$$

$$\frac{df(P, \phi(P))}{dP} = \frac{dC_1(P)^T \phi(P)}{dP} + \frac{dC_2(P)^T \phi_2}{dP} + \Lambda^T \left( \frac{db(P)}{dP} - \frac{\partial M(P)\phi(P)}{\partial P} \right)$$

The complexity of solving the first equation is that of solving the same nominal sparse linear system with multiple right hand sides. The number of right hand sides is equal to $1+n_O$. Therefore, the complexity of solving all systems concurrently using Gaussian elimination is $O(B^2N)$. In other words, the complexity of our method is independent of the number of outputs, and indeed, one of the main pitfalls of the adjoint sensitivity method is avoided. Namely, the linear growth of the complexity as a function of the number of outputs. The Gaussian elimination complexity is inherited from the solution of the nominal system and therefore the incremental complexity of solving both systems as compared to solving only the original system is insignificant. The added complexity of forming $$\frac{dC_{1,2}(P)^T \phi(P)}{dP},$$

which is $n_O$ matrix-vector products, is $O(n_o n_p)$ due to the sparsity of matrices $C_1$ and $C_2$. Finally, the complexity of forming the term $$\frac{\partial M(P)\phi(P)}{\partial P},$$

which is $n_p$ sparse matrix-vector products, is $O(Nn_p)$. The total complexity is $O(B^2N+n_o n_p+Nn_p)$, which is $O(B^2N)$, i.e., it is the exact same complexity as solving only the nominal system. The memory complexity may also be shown to be $O(B^2N)$, which is the same memory complexity as the one required to solve for nominal resistance alone.

Figure 9:
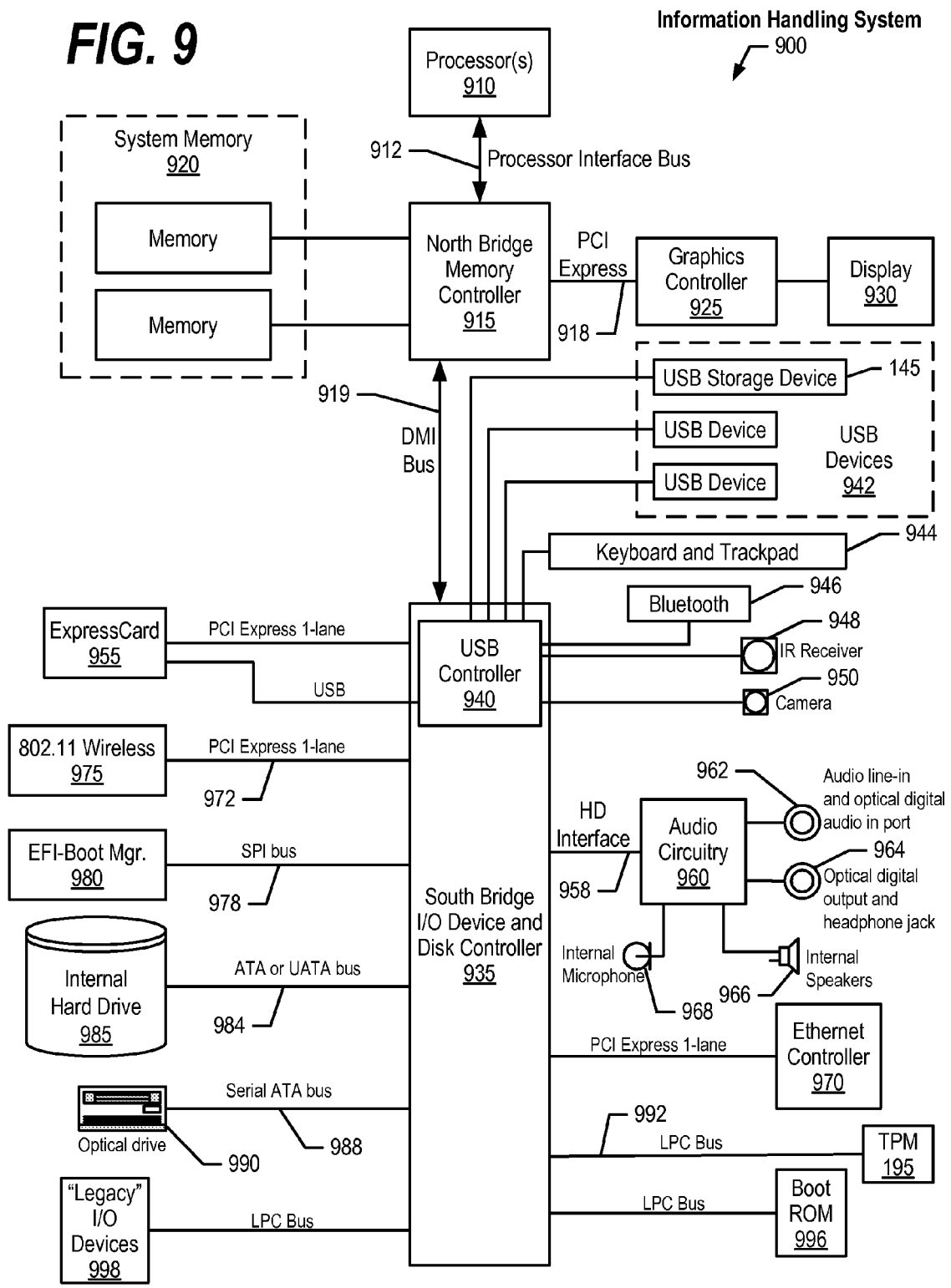
FIG. 9 illustrates an information handling system, which is a simplified example of a computer system capable of performing the computing operations described herein.

FIG. 9 illustrates information handling system 900, which is a simplified example of a computer system capable of performing the computing operations described herein. Information handling system 900 includes one or more processors 910 coupled to processor interface bus 912. Processor interface bus 912 connects processors 910 to Northbridge 915, which is also known as the Memory Controller Hub (MCH). Northbridge 915 connects to system memory 920 and provides a means for processor(s) 910 to access the system memory. Graphics controller 925 also connects to Northbridge 915. In one embodiment, PCI Express bus 918 connects Northbridge 915 to graphics controller 925. Graphics controller 925 connects to display device 930, such as a computer monitor.

Northbridge 915 and Southbridge 935 connect to each other using bus 919. In one embodiment, the bus is a Direct Media Interface (DMI) bus that transfers data at high speeds in each direction between Northbridge 915 and Southbridge 935. In another embodiment, a Peripheral Component Interconnect (PCI) bus connects the Northbridge and the Southbridge. Southbridge 935, also known as the I/O Controller Hub (ICH) is a chip that generally implements capabilities that operate at slower speeds than the capabilities provided by the Northbridge. Southbridge 935 typically provides various busses used to connect various components. These busses include, for example, PCI and PCI Express busses, an ISA bus, a System Management Bus (SMBus or SMB), and/or a Low Pin Count (LPC) bus. The LPC bus often connects low-bandwidth devices, such as boot ROM 996 and "legacy" I/O devices (using a "super I/O" chip). The "legacy" I/O devices (998) can include, for example, serial and parallel ports, keyboard, mouse, and/or a floppy disk controller. The LPC bus also connects Southbridge 935 to Trusted Platform Module (TPM) 995. Other components often included in Southbridge 935 include a Direct Memory Access (DMA) controller, a Programmable Interrupt Controller (PIC), and a storage device controller, which connects Southbridge 935 to nonvolatile storage device 985, such as a hard disk drive, using bus 984.

ExpressCard 955 is a slot that connects hot-pluggable devices to the information handling system. ExpressCard 955 supports both PCI Express and USB connectivity as it connects to Southbridge 935 using both the Universal Serial Bus (USB) the PCI Express bus. Southbridge 935 includes USB Controller 940 that provides USB connectivity to devices that connect to the USB. These devices include webcam (camera) 950, infrared (IR) receiver 948, keyboard and trackpad 944, and Bluetooth device 946, which provides for wireless personal area networks (PANs). USB Controller 940 also provides USB connectivity to other miscellaneous USB connected devices 942, such as a mouse, removable nonvolatile storage device 945, modems, network cards, ISDN connectors, fax, printers, USB hubs, and many other types of USB connected devices. While removable nonvolatile storage device 945 is shown as a USB-connected device, removable nonvolatile storage device 945 could be connected using a different interface, such as a Firewire interface, etcetera.

Wireless Local Area Network (LAN) device 975 connects to Southbridge 935 via the PCI or PCI Express bus 972. LAN device 975 typically implements one of the IEEE 802.11 standards of over-the-air modulation techniques that all use the same protocol to wirelessly communicate between information handling system 900 and another computer system or device. Optical storage device 990 connects to Southbridge 935 using Serial ATA (SATA) bus 988. Serial ATA adapters and devices communicate over a high-speed serial link. The Serial ATA bus also connects Southbridge 935 to other forms of storage devices, such as hard disk drives. Audio circuitry 960, such as a sound card, connects to Southbridge 935 via bus 958. Audio circuitry 960 also provides functionality such as audio line-in and optical digital audio in port 962, optical digital output and headphone jack 964, internal speakers 966, and internal microphone 968. Ethernet controller 970 connects to Southbridge 935 using a bus, such as the PCI or PCI Express bus. Ethernet controller 970 connects information handling system 900 to a computer network, such as a Local Area Network (LAN), the Internet, and other public and private computer networks.

While FIG. 9 shows one information handling system, an information handling system may take many forms. For example, an information handling system may take the form of a desktop, server, portable, laptop, notebook, or other form factor computer or data processing system. In addition, an information handling system may take other form factors such as a personal digital assistant (PDA), a gaming device, ATM machine, a portable telephone device, a communication device or other devices that include a processor and memory.

The Trusted Platform Module (TPM 995) shown in FIG. 9 and described herein to provide security functions is but one example of a hardware security module (HSM). Therefore, the TPM described and claimed herein includes any type of HSM including, but not limited to, hardware security devices that conform to the Trusted Computing Groups (TCG) standard, and entitled "Trusted Platform Module (TPM) Specification Version 1.2."

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While particular embodiments of the present disclosure have been shown and described, it will be obvious to those skilled in the art that, based upon the teachings herein, that changes and modifications may be made without departing from this disclosure and its broader aspects. Therefore, the appended claims are to encompass within their scope all such changes and modifications as are within the true spirit and scope of this disclosure. Furthermore, it is to be understood that the disclosure is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to disclosures containing only one such element, even when the same claim includes the introductory phrases "one or more" or "at least one" and indefinite articles such as "a" or "an"; the same holds true for the use in the claims of definite articles.

What is claimed is:

1. A computer-implemented method comprising:
   selecting a shape included in a layout file corresponding to an integrated circuit;
   selecting a first contact and a second contact located on the shape;
   computing, by a processor, an adjoint system vector based upon a perturbed boundary of the shape;
   computing, by the processor, a resistance sensitivity between the first contact and the second contact using the adjoint system vector;
   computing, by the processor, a nominal resistance between the first contact and the second contact based upon a nominal boundary of the shape; and
   simulating the integrated circuit using the computed resistance sensitivity and the computed nominal resistance.

2. The method of claim 1 further comprising:
   computing a derivative of a system matrix for the shape, resulting in a system matrix derivative, the system matrix including a plurality of coefficients that correspond to a plurality of nodes that are overlayed on the shape;
   computing a derivative of an output vector, resulting in an output vector derivative, the output vector corresponding to electrical current passing between the first contact and the second contact;
   computing a derivative of an input vector, resulting in an input vector derivative, the input vector corresponding to potentials imposed on the first contact and the second contact; and
   wherein the computing of the adjoint system vector includes the system matrix derivative, the output vector derivative, and the input vector derivative.

3. The method of claim 2 further comprising:
   computing a derivative of output current using the adjoint system vector, resulting in an output current derivative; and
   using the output current derivative in the computing of the resistance sensitivity.

4. The method of claim 2 wherein the plurality of nodes includes internal nodes and boundary nodes, the method further comprising:
   wherein the internal nodes are fixed in position between the nominal boundary and the perturbed boundary; and
   wherein the boundary nodes fluctuate in position between the nominal boundary and the perturbed boundary.

5. The method of claim 1 further comprising:
   wherein the perturbed boundary varies from the nominal boundary in both a first plane and a second plan, the first plane being perpendicular to the second plane; and
   wherein the nominal resistance and the resistance sensitivity are computed for a non-homogeneous conducting medium.

6. The method of claim 1 wherein the shape couples a first substrate layer to a second substrate layer, and wherein the first contact resides on the first substrate layer and the second contact resides on the second substrate layer.

7. The method of claim 1 further comprising:
   wherein the resistance sensitivity is computed with respect to one or more perturbations in one or more contact boundaries; and
   wherein the perturbed boundary is based upon one or more manufacturing variables for creating the integrated circuit.

8. An information handling system comprising:
   one or more processors;
   a memory accessible by at least one of the processors;
   a set of instructions stored in the memory and executed by at least one of the processors in order to perform actions of:
     selecting a shape included in a layout file corresponding to an integrated circuit;
     selecting a first contact and a second contact located on the shape;
     computing an adjoint system vector based upon a perturbed boundary of the shape;
     computing a resistance sensitivity between the first contact and the second contact using the adjoint system vector;
     computing a nominal resistance between the first contact and the second contact based upon a nominal boundary of the shape; and
     simulating the integrated circuit using the computed resistance sensitivity and the computed nominal resistance.

9. The information handling system of claim 8 wherein the set of instructions, when executed by at least one of the processors, further performs actions of:
- computing a derivative of a system matrix for the shape, resulting in a system matrix derivative, the system matrix including a plurality of coefficients that correspond to a plurality of nodes that are overlayed on the shape;
- computing a derivative of an output vector, resulting in an output vector derivative, the output vector corresponding to electrical current passing between the first contact and the second contact;
- computing a derivative of an input vector, resulting in an input vector derivative, the input vector corresponding to potentials imposed on the first contact and the second contact; and
- wherein the computing of the adjoint system vector includes the system matrix derivative, the output vector derivative, and the input vector derivative.

10. The information handling system of claim 9 wherein the set of instructions, when executed by at least one of the processors, further performs actions of:
- computing a derivative of output current using the adjoint system vector, resulting in an output current derivative; and
- using the output current derivative in the computing of the resistance sensitivity.

11. The information handling system of claim 8 further comprising:
- wherein the perturbed boundary varies from the nominal boundary in both a first plane and a second plan, the first plane being perpendicular to the second plane; and
- wherein the nominal resistance and the resistance sensitivity are computed for a non-homogeneous conducting medium.

12. The information handling system of claim 8 wherein the shape couples a first substrate layer to a second substrate layer, and wherein the first contact resides on the first substrate layer and the second contact resides on the second substrate layer.

13. A computer program product stored in a non-transitory computer readable storage medium, comprising functional descriptive material that, when executed by an information handling system, causes the information handling system to perform actions that include:
- selecting a shape included in a layout file corresponding to an integrated circuit;
- selecting a first contact and a second contact located on the shape;
- computing an adjoint system vector based upon a perturbed boundary of the shape;
- computing a resistance sensitivity between the first contact and the second contact using the adjoint system vector;
- computing a nominal resistance between the first contact and the second contact based upon a nominal boundary of the shape; and
- simulating the integrated circuit using the computed resistance sensitivity and the computed nominal resistance.

14. The computer program product of claim 13 wherein the functional descriptive material, when executed by the information handling system, causes the information handling system to further perform actions of:
- computing a derivative of a system matrix for the shape, resulting in a system matrix derivative, the system matrix including a plurality of coefficients that correspond to a plurality of nodes that are overlayed on the shape;
- computing a derivative of an output vector, resulting in an output vector derivative, the output vector corresponding to electrical current passing between the first contact and the second contact;
- computing a derivative of an input vector, resulting in an input vector derivative, the input vector corresponding to potentials imposed on the first contact and the second contact; and
- wherein the computing of the adjoint system vector includes the system matrix derivative, the output vector derivative, and the input vector derivative.

15. The computer program product of claim 14 wherein the functional descriptive material, when executed by the information handling system, causes the information handling system to further perform actions of:
- computing a derivative of output current using the adjoint system vector, resulting in an output current derivative; and
- using the output current derivative in the computing of the resistance sensitivity.

16. The computer program product of claim 13 further comprising:
- wherein the perturbed boundary varies from the nominal boundary in both a first plane and a second plan, the first plane being perpendicular to the second plane; and
- wherein the nominal resistance and the resistance sensitivity are computed for a non-homogeneous conducting medium.

17. The computer program product of claim 13 wherein the shape couples a first substrate layer to a second substrate layer, and wherein the first contact resides on the first substrate layer and the second contact resides on the second substrate layer.

* * * * *